United States Patent
Mao

(10) Patent No.: US 9,086,462 B2
(45) Date of Patent: Jul. 21, 2015

(54) SYSTEMS AND METHODS FOR BATTERY PARAMETER ESTIMATION

(75) Inventor: Xiaofeng Mao, Novi, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 349 days.

(21) Appl. No.: 13/586,494

(22) Filed: Aug. 15, 2012

(65) Prior Publication Data

US 2014/0049226 A1 Feb. 20, 2014

(51) Int. Cl.
*G01R 21/06* (2006.01)
*G01R 31/36* (2006.01)
*H01M 10/42* (2006.01)

(52) U.S. Cl.
CPC ........ *G01R 31/3651* (2013.01); *G01R 31/3679* (2013.01); *H01M 10/42* (2013.01)

(58) Field of Classification Search
CPC ............ B60L 11/1611; Y02T 10/7038; Y02T 10/7044; Y02T 10/7283
USPC ................. 320/104, 107, 124–128, 137, 162; 702/63; 324/430, 433
See application file for complete search history.

(56) References Cited

U.S. PATENT DOCUMENTS

| | | | |
|---|---|---|---|
| 8,116,998 B2 | 2/2012 | Hess | |
| 2006/0181245 A1* | 8/2006 | Mizuno et al. | 320/132 |
| 2007/0159137 A1 | 7/2007 | Verbrugge et al. | |
| 2009/0055330 A1* | 2/2009 | Medasani et al. | 706/2 |
| 2009/0248334 A1* | 10/2009 | Sans et al. | 702/63 |
| 2009/0265125 A1* | 10/2009 | Zhang | 702/63 |
| 2011/0060538 A1* | 3/2011 | Fahimi et al. | 702/63 |
| 2013/0110429 A1* | 5/2013 | Mitsuyama et al. | 702/63 |

OTHER PUBLICATIONS

Daniel Le et al., Lithium-ion Battery State of Health Estimation Using Ah-V Characterization, article, 2011, 7 pgs.
Bhaskar Saha et al., Prognostics Methods for Battery Health Monitoring Using a Bayesian Framework, article, Feb. 2009, 6 pgs., IEEE Transactions on Instrumentation and Measurement, vol. 58, No. 2.

\* cited by examiner

*Primary Examiner* — Paul Dinh
(74) *Attorney, Agent, or Firm* — Phillips Ryther & Winchester; Jared L. Cherry

(57) ABSTRACT

The present disclosure relates to estimation of battery parameters, including SOC and SOH using a plurality of particles, each of which represents at least one parameter and at least one state of a battery system. A system model may simulate the battery system using processing logic. Each of the plurality of particles may propagate through the system model to generate a plurality of modeled particle values, each of which may be compared to a measurement of an electrical parameter of the battery system. Each particle may be weighted based upon a comparison of the modeled particle value and the measurement. A successive plurality of particles may be generated based upon the weight assigned to each of the plurality of modeled particle values. A number of iterations may be performed to generate a tuned plurality of modeled particle values, upon which an estimated parameter of the battery system may be based.

19 Claims, 4 Drawing Sheets

SYSTEMS AND METHODS FOR BATTERY PARAMETER ESTIMATION

TECHNICAL FIELD

This disclosure relates to systems and methods for estimation of battery parameters, including battery state of charge ("SOC") and/or battery state of health ("SOH"). More specifically, but not exclusively, this disclosure relates to system and methods for estimating SOC and/or SOH using a particle filter method and/or a Sequential Monte Carlo method to estimate battery parameters, such as an open circuit voltage.

BACKGROUND

Operation of a battery system is dynamic and performance of a battery system varies significantly with age. The capacity of a battery degrades over the life of the battery. Over-charging and over-depleting may accelerate the degradation of battery capacity. Accordingly, control systems may be utilized in order to prevent over-charging and over-depletion to improve the lifespan of the battery system. In addition, the capacity of a battery may be affected by temperature and other operating conditions.

The capacity of a battery system included in an electric vehicle ("EV") and plug-in hybrid electric vehicle ("PHEV") may constrain the range of the vehicle. A battery system's SOH is a qualitative measure of a battery's ability to store and deliver electrical energy, while a battery system's state of charge (SOC) is a measure of electrical energy stored in the battery. Battery diagnostic and prognostic methods may be used to maintain proper battery operation and to provide a user with an indication of when the battery will become depleted. Battery diagnostics may track the degradation of battery's performance to estimate battery SOH and may track the SOC.

Control systems for estimating parameters of a battery system may incorporate algorithms such as the Kalman filter design, the classic least square design, and the extended Kalman filter design. Such systems, however, may not be suitable for some applications based on the time needed to estimate battery parameters, difficulty of such designs in adapting to changes resulting from battery age, battery variations, and operating conditions (e.g. temperature and SOC). Further, such systems typically estimate either battery states or battery parameters, but may not allow for concurrent estimation of both battery states and battery parameters. Finally, such systems may have difficulty recovering from an inaccurate estimation or measurement of an initial SOC or a battery capacity.

SUMMARY

Systems and methods are presented herein for estimation of battery parameters, including SOC and SOH using a plurality of particles, each of which represents one or more states and parameters of a battery system. A system model may be employed to simulate the battery system using processing logic. Each of the plurality of particles may propagate through the system model and may result in a corresponding plurality of modeled particle values. Each of the plurality of modeled particle values may be compared to a measurement of an electrical parameter of the battery system. Each particle may be weighted based upon a comparison of the modeled particle value and the measurement. A successive plurality of particles may be generated based upon the weight assigned to each of the plurality of modeled particle values. A desired number of iterations may be performed to generate a tuned plurality of modeled particle values, upon which an estimated parameter of the battery system may be based.

A variety of parameters and states of the battery system may be jointly estimated, such as an open-circuit voltage, an SOC, and SOH, and/or any desired system parameter that may be estimated using the systems and methods disclosed herein. Estimated parameters of the battery system may be utilized to control charging and depletion of the battery system and/or to provide information to a user.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
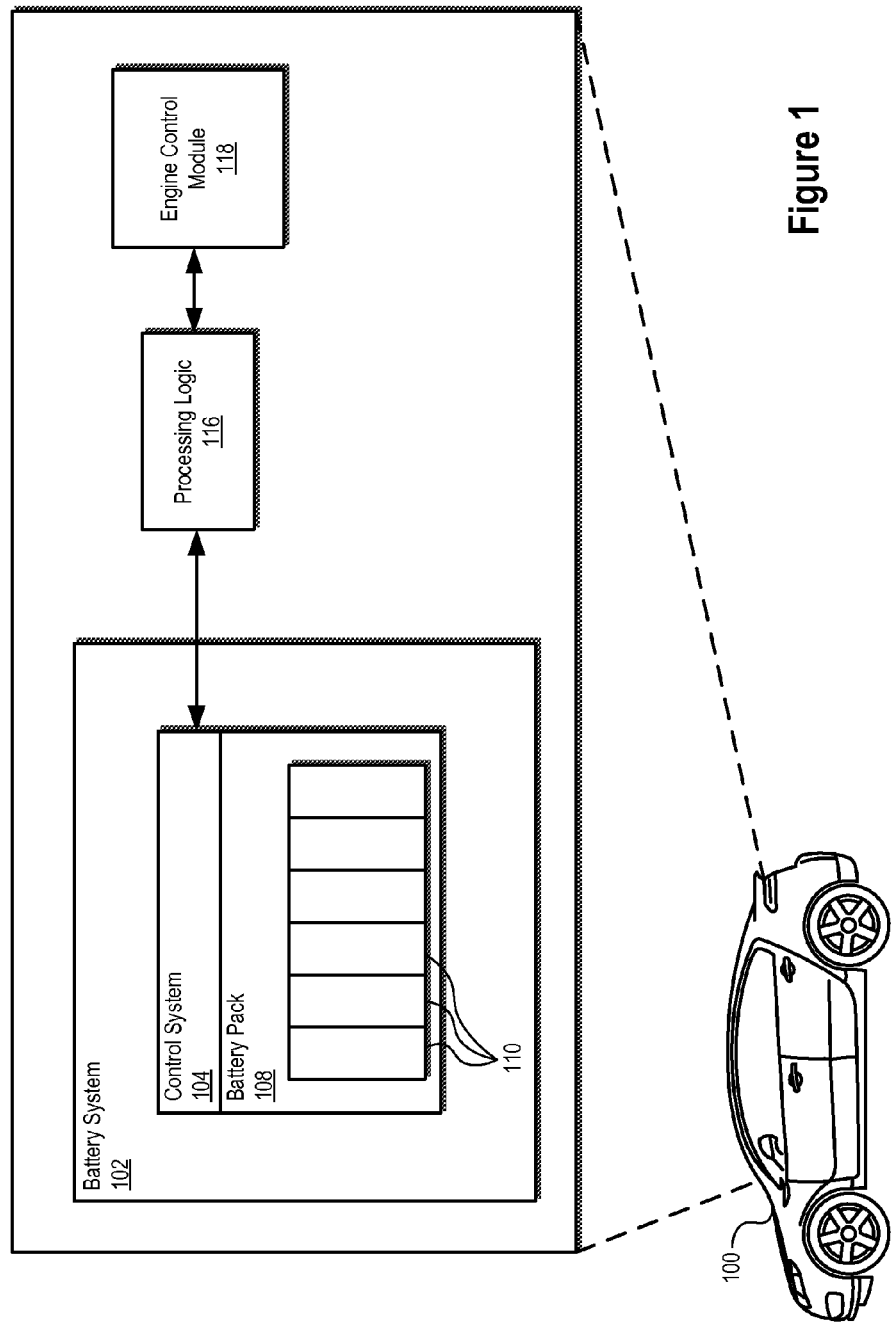
FIG. 1 illustrates an exemplary system for estimating parameters associated with a battery system in a vehicle.

A detailed description of systems and methods consistent with embodiments of the present disclosure is provided below. While several embodiments are described, it should be understood that disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Disclosed herein are systems and methods for estimation of parameters of a battery system. The systems and methods disclosed herein may allow improvements in systems and methods for battery parameter estimation. According to some embodiments, improvements in the speed of generating an estimate of various battery system parameters may be realized. According to other embodiments, improved adaptation to changes resulting from battery age, battery variations, and operating conditions (e.g. temperature and SOC) may be realized. Still further, improvements in accuracy may be realized based upon improved adaptation and/or improved efficiency in generating an estimate of various battery system parameters. As a result of improved accuracy in estimating battery parameters, a variety of benefits may be realized, such as improvements in fuel economy in embodiments in which an internal combustion engine (ICE) is used to charge a battery system; improvements in battery control; prolonged battery system life, reduced cost of battery system replacement, and reduced calibration to account for variations among individual batteries.

Various embodiments disclosed herein may estimate both battery states and parameters by a randomized sequential modeling process refined using measurements from the battery system. Accordingly, the systems and methods disclosed herein may be able to adapt to changes in operating conditions and change in battery conditions over the life of the battery. Further, the systems and methods disclosed herein may require less calibration due to the robust capacities of the modeling techniques utilized in connection with various embodiments of the present disclosure. Still further, various embodiments disclosed herein may incorporate battery capacity information, if such information is available, in order to improve the estimation process. If battery capacity is not precisely known, the systems and methods of the present disclosure may provide an estimate of battery capacity that is refined through successive iterations of a modeling process.

According to certain embodiments, an open circuit voltage of a battery may be estimated, and may be used in order to calculate estimates of other parameters, such as the battery system's SOC and/or SOH. According to various embodiments, an iterative algorithm may be used to refine and tune a plurality of parameters that may be used to simulate the battery. According to certain embodiments, a particle filter method and/or a Sequential Monte Carlo method may be used. Embodiments based upon the Sequential Monte Carlo Method may rely upon on repeated random sampling tuned parameters used to simulate a battery system. Using measurements from the battery, successive iterations may yield increasingly accurate estimations of the battery system. Improvements in the accuracy of the estimations may be attributed to tuning a variety of battery parameters in successive iterations of an algorithm.

Various embodiments disclosed herein may utilize random values in modeling a battery system. As used herein, the term random refers to a value that may be determined probabilistically and/or semi-probabilistically, as opposed to deterministically. Various types of random values may be used in connection with certain embodiments consistent with the present disclosure. For example, certain embodiments may generate random values within certain bounded ranges. The boundaries of such ranges may be predetermined, may also be random, or may be a combination of random and predetermined values. According to certain embodiments, pseudorandom numbers may also be utilized. For purposes of the present disclosure, pseudorandom values may be considered random values.

FIG. 1 illustrates an exemplary system for estimating parameters associated with a battery system 102 in a vehicle 100. Vehicle 100 may be an a motor vehicle, a marine vehicle, an aircraft, and/or any other type of vehicle, and may include an ICE drivetrain, an electric motor drivetrain, a hybrid engine drivetrain, a fuel cell ("FC") drivetrain, and/or any other type of drivetrain suitable for incorporating the systems and methods disclosed herein. Vehicle 100 may include battery system 102 that, in certain embodiments, may be a high-voltage ("HV") battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like.

Battery system 102 may include a control system 104. Control system 104 may be configured to monitor and control certain operations of battery system 102. For example, control system 104 may be configured to monitor and control charging and/or discharging operations of the battery system 102. In certain embodiments, control system 104 may be communicatively coupled with one or more sensors, actuation devices (e.g., electrical relays), and/or systems configured to enable to control system 104 to monitor and control operations of battery system 102. Control system 104 may further be configured to provide information to and/or receive information from other systems included in vehicle 100. For example, control system 104 may be communicatively coupled with processing logic 116, and/or an engine control module ("ECM") 118. In certain embodiments, the processing logic 116 may be configured, at least in part, to provide information regarding the battery system 102 to a user of the vehicle 100 including, for example, battery SOC information, battery operating time information, battery SOH information, battery operating temperature information, and/or any other information regarding the battery system 102 of interest to a user.

Battery system 102 may include one or more battery packs 108 suitably sized to provide sufficient electrical power to the vehicle 100. Each battery pack 108 may include one or more battery modules 110. The battery modules 110 may comprise one or more battery cells utilizing any suitable battery technology including, for example, lead-acid, nickel-metal hydride ("NiMH"), lithium-ion ("Li-Ion"), Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), and/or any other suitable battery technologies.

Processing logic 116 may be configured to model battery system 102 and to generate an estimate of various parameters associated with battery system 102. According to various embodiments, a plurality of particles may be generated, each of which represents at least one set of parameters and state variables of battery system 102. Each of the plurality particles may propagate through the system model. Based upon a comparison of measurements of the battery system 102 and the results of the system model associated with each particle, a weight may be assigned to each particle. A successive plurality of particles based upon the weight assigned to each of the plurality of particles may be generated, and the process may be iteratively repeated. Estimated values of parameters of battery system 102 may be generated that relate to the open-circuit voltage of battery system 102, and SOC of battery system 102, and SOH of battery system 102, and/or other parameters associated with a system model of battery system 102, as described in greater detail below in connection with FIG. 4A and FIG. 4B.

A variety of actions may be taken based upon the results of the estimation of a particular parameter of battery system 102.

For example, when the SOC of battery system 102 falls below a specific threshold, a charging operation may be initiated by starting an internal combustion engine (not shown) in communication with an electrical alternator (not shown) or other suitable power system to charge battery system 102 and to prevent over-depletion of battery system 102. Further, when the SOC of battery system 102 exceeds a specified threshold, the internal combustion engine or other power system may be stopped in order to prevent overcharging battery system 102. In further embodiments, an estimated SOH of battery system 102 may also be generated using processing logic 116. An estimated SOH may be used to provide an indication to a user that battery system 102 requires replacement.

Figure 2A:
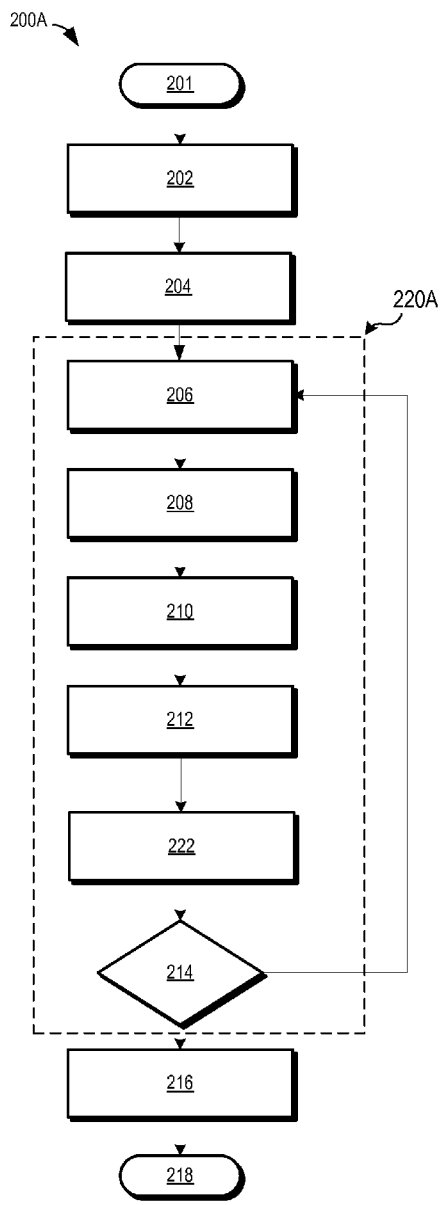
FIG. 2A illustrates a flow chart of an exemplary method for battery parameter estimation consistent with embodiments disclosed herein.
Figure 2B:
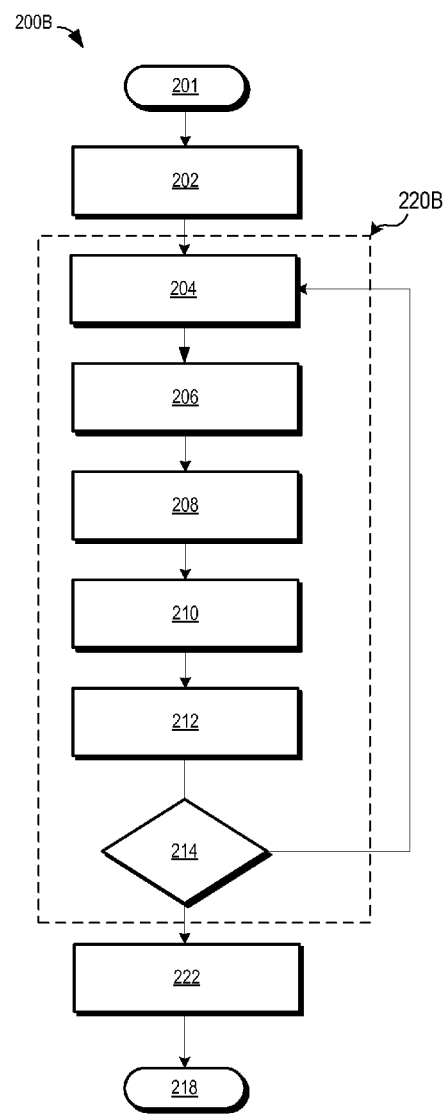
FIG. 2B illustrates a flow chart of an exemplary method for battery parameter estimation consistent with embodiments disclosed herein.

FIG. 2A and FIG. 2B illustrate flow charts of exemplary methods 200A and 200B, respectively, for estimating at least one set of parameters and state variables of a battery system by generating a tuned plurality of modeled particle values. In certain embodiments, at least one set of parameters and state variables of the battery system may be estimated concurrently. As illustrated, methods 200A and 200B include many of the same elements; however, in method 200A, element 204 is outside of an iterative process 220A, while in method 200B, element 204 is inside of an iterative process 220B. Further, according to the embodiment illustrated in FIG. 2A, element 222 is inside of iterative process 220A, while in FIG. 2B element 222 is outside of iterative process 220B. Common elements of methods 200A and 200B are jointly described below.

At 202, a desired number of particles may be generated and parameters of each particle may be set to initial conditions. Each particle in the set may represent a vector of parameters and state variables that may be modeled and used to predict the system output. The predicted output may be compared to acquired measurements from the system being modeled. According to certain embodiments, the initial parameters of one or more particles in the initial particle set may be random values and/or reasonable best guesses. The random values may, according to one embodiment, be set within bounded ranges corresponding to physical maximum and minimum of a battery system. In other embodiments, the initial parameters and state variables of particles in the initial particle set may be set to predetermined values. For example, the values of the particles may be distributed between minimum and maximum values for a given parameter in the system being modeled. Still further, the values of some parameters of a given particle may be set randomly while other parameters of the particle may be predetermined. The plurality of particles generated at 202 may be initially assigned equal weight or the particles may have varying weights. According to other embodiments, weights assigned to various particles may be based upon prior determined values or based upon predetermined weights.

In certain embodiments, iterative processes 220A and 220B may be performed a specified number of times. The specified number of iterations may be represented by a variable, i, and a counter variable, k, may represent the number of iterations that have been performed. The counter variable k may be initialized to the value of 1, and may be incremented at the conclusion of the iterative process (i.e., at the conclusion of each iteration k=k+1). The iterative process may continue until k=i, at which point iterative processes 220A and 220B may terminate.

Measurements of electrical parameters of a battery system may be acquired at 204. As indicated in FIG. 2A, measurements of electrical parameters of the battery system may be acquired outside of iterative process 220A. In other words, measurements of electrical parameters acquired at 204 may be utilized in connection with multiple iterations of iterative process 220A. On the other hand, as indicated in FIG. 2B, measurements of electrical parameters may be included in iterative process 220B.

According to one embodiment, the measurements of electrical parameters may include a voltage of a battery terminal and a current drawn from the battery. According to other embodiments, other parameters may be measured including, for example, the impedance of the battery (e.g., real and/or imaginary). Measurements of electrical characteristics associated with the battery may be acquired using appropriate sensors, such as voltage sensors, current sensors, and/or impedance sensors.

The plurality of particles may be propagated through a model and modeled values may be determined at 206. Any number of techniques and models may be utilized in order to model a particular system. For example, as explained in connection with FIGS. 4A and 4B, a lithium-ion battery may be modeled as either a single or a dual RC circuit. More or less complicated models and/or techniques may be utilized depending upon a desired level of accuracy and available resources that may be devoted to a modeling engine. For example, a tradeoff may exist between accuracy and computational resources. A balance of a desired level of accuracy, a desired time for simulation, and/or an available amount of available computational resources may be determined for specific applications.

At 208, a weight of each particle may be assigned based upon the correlation between the modeled value and the measured value. A high correlation between the modeled value and a measured value may result in the corresponding particle receiving a greater weight, while a low correlation between a modeled value and a measured value may result in the corresponding particle receiving a lower weight. Various embodiments may assign different weights based upon various characteristics.

The particles may be resampled at 210 based upon the weight assigned to each particle. The resampling of the particles may involve a process of generating a successive plurality of particles in which particles of a higher weight in the previous plurality of particles have a greater possibility to be duplicated in the successive plurality of particles. According to certain embodiments, particles that correspond to a particle having a higher weight may have values that are distributed about the value associated with the original particle.

At 212, an estimate of a desired characteristic may be determined. According to one embodiment, an open circuit voltage of a battery may be the characteristic to be determined. The present SOC of a battery may be inferred from the determined open circuit voltage using a known relationship. For example, some batteries exhibit a sloping characteristic of SOC versus open circuit voltage. A higher open SOC corresponds to a higher open circuit voltage, and similarly, a lower SOC corresponds to a lower open circuit voltage. According to certain embodiments, a lookup table may be employed to correlate the SOC to the open circuit voltage. The estimation of the open circuit voltage may also be utilized to estimate additional parameters, such as the capacity of a battery or the SOH of the battery. The capacity of the battery may be used to determine the SOH of the battery based on a ratio of the estimated battery capacity $C_i$ and the original battery capacity, $C_0$, as expressed in Eq. 1:

$$SOH = \left(\frac{C_i}{C_0}\right) * 100 \qquad \text{Eq. 1}$$

In Eq. 1, $C_i$ is the $i^{th}$ measurement in time.

At 214, it may be determined whether an iteration of the simulation is to be performed. Increasing the number of iterations may allow for improving the estimates of the battery parameters. According to certain embodiments, the simulation may complete a specified number of iterations each time the battery is activated. According to other embodiments, the simulation may run a desired number of iterations based upon the time of operation of a battery system. For example, the simulation may complete N iterations for each M hours that the battery is in operation, where N and M are numbers determined based upon a particular use and a desired level of precision. In still other embodiments, the simulation may run continuously while the battery is in use in order to track the state of the battery and to tune the parameters associated with the simulation. If a desired number of simulations have been completed, method 200 may terminate at 218. Otherwise, method 200 may iterate at 206.

At 216, the tuned plurality of modeled particle values may be used to estimate one or more parameters of the battery system. The estimate at 216 may differ from the estimate at 212 since the iterative process 220A is complete, and thus the tuning of the plurality of modeled particle values is likely to be a more accurate representation of the battery system. As indicated in FIG. 2B, element 216 may be omitted in certain embodiments, and the plurality of estimates of a desired characteristic at 212 may be utilized.

Element 222, which may be performed either as a part of an iterative process, as illustrated in FIG. 2A, or at the conclusion of an iterative process, as illustrated in FIG. 2B. At 222, a smoothing algorithm may be applied to the estimate of the desired characteristic determined at 212. A variety of smoothing algorithms may be utilized in connection with various embodiments, including, but not limited to additive smoothing, a Butterworth filter, exponential smoothing, a Kalman filter, a kernel smoother, Laplacian smoothing, a low-pass filter, a moving average, a recursive filter, Savitzky-Golay smoothing, etc.

The differences illustrated in FIGS. 2A and 2B reflect a variety of modifications that may be implemented in connection with various embodiments disclosed herein. For example, more or fewer elements may be included within an iterative process than are shown in either FIGS. 2A and 2B. Further, additional calculations may be performed based upon estimated battery system parameters.

Figure 3:
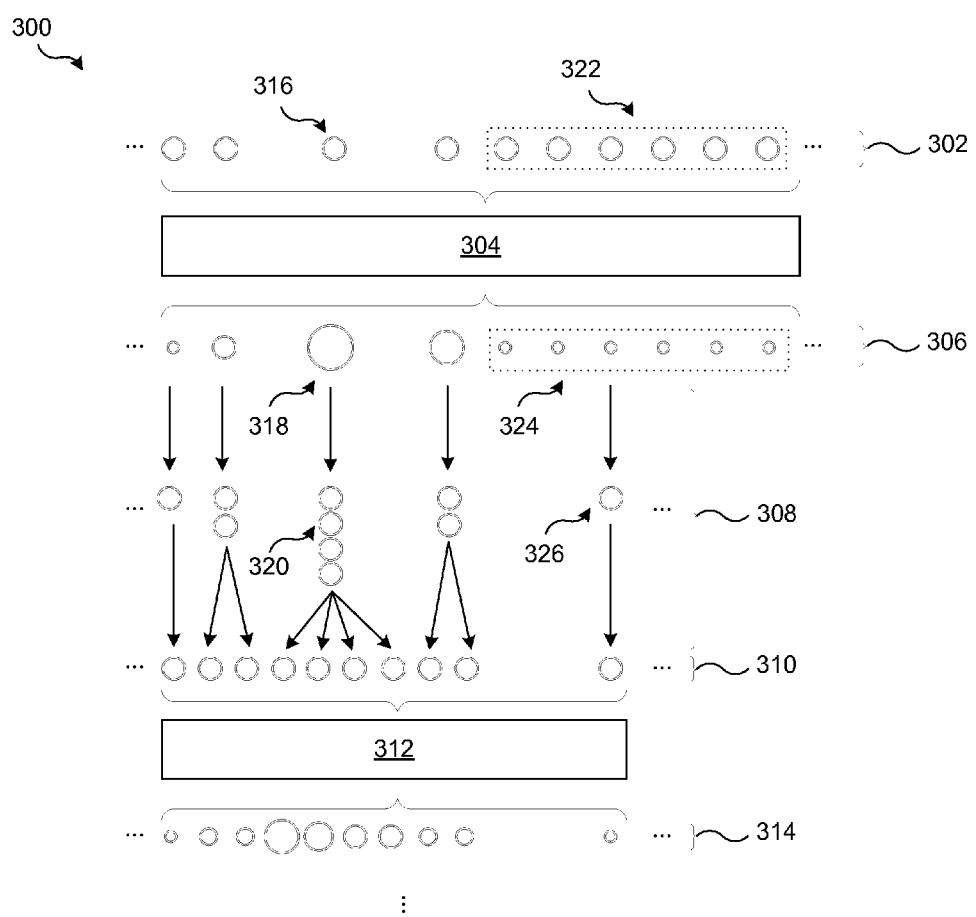
FIG. 3 illustrates a conceptual representation of a method for battery parameter estimation consistent with embodiments disclosed herein.

FIG. 3 illustrates a conceptual representation of a method 300 for battery parameter estimation consistent with embodiments disclosed herein. At 302, N random particles with equal weight are generated. Each particle may represent a vector of states and parameters that will be modeled and compared to measurements from the system being modeled. The N random particles with equal weight propagate through a system model, which predicts output for each particle at 304. At 306, the particle weights may be adjusted based on the error between the output predicted by the system model of each particle and the measurement of parameters from the system. In the conceptual illustration shown in FIG. 3, the weight is indicated by the size of the particle. The larger the particle at 306, the more closely the predicted value associated with the particle corresponds to measured values from the system being modeled.

At 308, a second set of particles is created based upon the weights assigned to the particles at 306. In the new set of particles, particles having higher weight at 306 are more likely to be duplicated, while particles having a lower weight at 306 are less likely to be duplicated. According to some embodiments, the vector values of particles in successive iterations will be clustered around the original values that lead to the heavily weighted particle. In this manner, the parameters may be tuned incrementally. For example, in the illustrated embodiments, the particle 316 resulted in the closest approximation to the measured values, and accordingly, particle 316 received the highest weight. The second set of particles, therefore, includes 4 particles that may be clustered around the original values of particle 316. Similarly, the particles designated at 322 resulted in values having a small weight. Accordingly, the second set of particles includes only one corresponding particle. According to certain embodiments, the six particles designated at 322 may provide upper and lower boundaries for successive modeling iterations.

At 310, the second set of particles may be randomized and again assigned equal particle weights. The randomization of the second set of particles may introduce an element of randomness into the particles while still relying on the weights of each particle from the previous iteration of method 300. For example, randomization of particles at 310 may be achieved by generating random numbers within bounded ranges based upon the weighted particles in the previous iteration.

At 312, the second set of particles may propagate through the system model. The second set of particles are weighted based upon an error between the output predicted by the system model of each particle and of the measured parameters from the system. Method 300 may iterate any suitable number of times.

In the conceptual illustration shown in FIG. 3, 10 particles are generated in the initial sample set. In the second sample set, shown at 308, the particles are clustered based upon the weight of each particle. As shown the largest particle, shown at 318, results in four particles, shown at 320, based upon the value of particle 316. In contrast, the group of particles shown at 322, receive relatively low weight, as shown at 324. Accordingly, only a single particle in the second set of particles, shown at 326, is based upon the original values of the group of particles shown at 322.

Figure 4A:
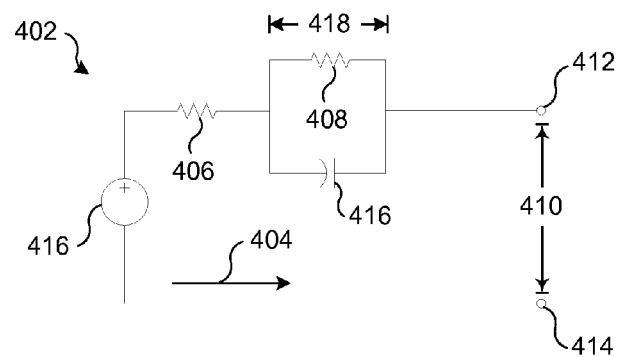
FIG. 4A illustrates an exemplary resistor-capacitor circuit for battery parameter estimation consistent with embodiments disclosed herein.

FIG. 4A illustrates an exemplary single resistor-capacitor equivalent circuit for modeling a li-ion battery. A voltage 410 between terminals 412 and 414 is given by Eq. 2.

$$V = V_{oc} + IR + V_{rc} \qquad \text{Eq. 2}$$

In Eq. 2, $V_{oc}$ is the voltage of source 416, I is a current 404, R is the resistance of resistor 406, and $V_{rc}$ is the voltage drop 418 across resistor 408 and capacitor 416. Eq. 3 represents the battery model after discretization.

$$\begin{bmatrix} V_{rc}(k+1) \\ V_{oc}(k+1) \end{bmatrix} = \begin{bmatrix} e^{-T/R_{rc}C_{rc}} & 0 \\ 0 & 1 \end{bmatrix} \begin{bmatrix} V_{rc}(k) \\ V_{oc}(k) \end{bmatrix} + \begin{bmatrix} R_{rc}(1 - e^{-T/R_{rc}C_{rc}}) \\ ST/C \end{bmatrix} I(k)$$

$$V(k) = \begin{bmatrix} 1 & 1 \end{bmatrix} \begin{bmatrix} V_{rc}(k) \\ V_{oc}(k) \end{bmatrix} + RI(k) \qquad \text{Eq. 3}$$

In Eq. 3, S represents the slope of the $V_{oc}$ versus the SOC curve, C is the battery capacity and T is the sample time, $R_{rc}$, is the resistance of resistor 408, and $C_{rc}$, is the capacitance of resistor 416. All the battery parameters (i.e., $R_{rc}$, $C_{rc}$, C and R)

are time-varying parameters depending on battery age, variation, and operating conditions (e.g., temperature and SOC). Capacity C, as a battery parameter, is also time-varying depending on battery age. The ohmic resistance R of resistor 406 may be estimated by Eq. 4 at the time steps where current/changes. Change in $V_{oc}$ may be limited by Eq. 3, while at the same time, $V_{oc}$ may be estimated by matching the measured battery voltage to the values of one or more modeled particles.

$$R = \frac{\Delta V}{\Delta I} \qquad \text{Eq. 4}$$

Figure 4B:
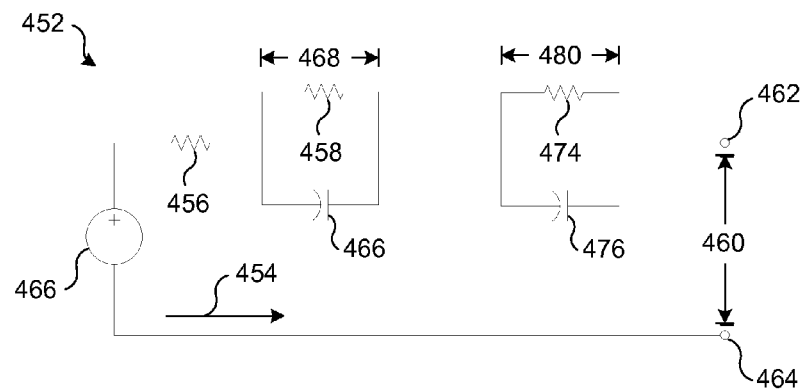
FIG. 4B illustrates an exemplary dual resistor-capacitor circuit for modeling a battery consistent with embodiments disclosed herein.

FIG. 4B illustrates an embodiment including a dual resistor-capacitor circuit that may be used to model a li-ion battery system. A voltage 460 between terminals 462 and 464 is given by Eq. 5.

$$V = V_{oc} + IR + V_{rc} \qquad \text{Eq. 5}$$

In Eq. 5, $V_{oc}$ is the voltage of source 466, I is a current 454, R is the resistance of resistor 456, $V_{dl}$ is the voltage drop 468 across resistor 458 and capacitor 466, and $V_{df}$ is the voltage drop 480 across resistor 474 and capacitor 476. Eq. 3 represents the battery model after discretization.

$$\begin{bmatrix} V_{dl}(k+1) \\ V_{df}(k+1) \\ V_{oc}(k+1) \end{bmatrix} = \begin{bmatrix} e^{-T/R_{ct}C_{dl}} & 0 & 0 \\ 0 & e^{-T/R_{df}C_{df}} & 0 \\ 0 & 0 & 1 \end{bmatrix} \begin{bmatrix} V_{dl}(k) \\ V_{df}(k) \\ V_{oc}(k) \end{bmatrix} + \qquad \text{Eq. 6}$$

$$\begin{bmatrix} R_{ct}(1 - e^{-T/R_{ct}C_{dl}}) \\ R_{df}(1 - e^{-T/R_{df}C_{df}}) \\ ST/C \end{bmatrix} I(k)$$

$$V(k) = \begin{bmatrix} 1 & 1 & 1 \end{bmatrix} \begin{bmatrix} V_{dl}(k) \\ V_{df}(k) \\ V_{oc}(k) \end{bmatrix} + RI(k)$$

In Eq. 6, S represents the slope of the $V_{oc}$ versus the SOC curve, C is the battery capacity and T is the sample time, $R_{rc}$, is the resistance of resistor 408, and $C_{rc}$, is the capacitance of resistor 416. All the battery parameters (i.e., $R_{ct}$, $C_{dl}$, $R_{dl}$, $C_{df}$, C and R) are time-varying parameters depending on battery age, variation, and operating conditions (e.g., temperature and SOC). Capacity C, as a battery parameter, is also time-varying depending on battery age.

Eq. 7 is an augmented Li-ion battery model by including all the parameters as part of the state vector.

$$\begin{bmatrix} V_{rc}(k+1) \\ V_{oc}(k+1) \end{bmatrix} = \begin{bmatrix} e^{-T/R_{rc}C_{rc}} & 0 \\ 0 & 1 \end{bmatrix} \begin{bmatrix} V_{rc}(k) \\ V_{oc}(k) \end{bmatrix} + \qquad \text{Eq. 7}$$

$$\begin{bmatrix} R_{rc}(1 - e^{-T/R_{rc}C_{rc}}) \\ ST/C \end{bmatrix} I(k) + \begin{bmatrix} w_1 \\ w_2 \end{bmatrix}$$

$$\begin{bmatrix} R_{rc}(k+1) \\ C_{rc}(k+1) \\ C(k+1) \end{bmatrix} = \alpha \begin{bmatrix} R_{rc}(k) \\ C_{rc}(k) \\ C(k) \end{bmatrix} + (1-\alpha) \begin{bmatrix} \overline{R_{rc}(k)} \\ \overline{C_{rc}(k)} \\ \overline{C(k)} \end{bmatrix} + \begin{bmatrix} w_3 \\ w_4 \\ w_5 \end{bmatrix}$$

$$V(k) = \begin{bmatrix} 1 & 1 \end{bmatrix} \begin{bmatrix} V_{rc}(k) \\ V_{oc}(k) \end{bmatrix} + RI(k) + w_6$$

In Eq. 7, $w_i$ (i=1,2,3,4,5,6) are noise which can be estimated or tuned; $\alpha$ is a tuning parameter; and $\overline{*(k)}$ denotes the mean of the parameter * at time step k. The tuning parameter, $\alpha$, may represent a confidence in the mean value of the parameter at the previous step.

Eq. 8 comprises an augmented state vector that may be utilized in connection with Eq. 7. The augmented state vector shown in Eq. 8 includes two battery states (i.e., $V_{oc}$ and C) and three battery parameters (i.e., $V_{rc}$, $R_{rc}$, and $C_{rc}$). These two battery states and three battery parameters are jointly modeled as each of a plurality of particles is propagated through a system model in iterative fashion, as described above.

$$[V_{rc} V_{oc} R_{rc} C_{rc} C] \qquad \text{Eq. 8}$$

As indicated in Eq. 8, capacity of the battery system, C, is one of the battery states included in the state vector. If the battery system capacity is assumed known, which may be obtained through capacity estimation during a charge process, the known value may be utilized in order to improve the capacity estimation.

The foregoing specification has been described with reference to various embodiments. Various modifications and changes may be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method for estimating a parameter of a battery system, comprising:
    generating an initial plurality of particles, each particle representing at least one parameter and at least one state of a battery system;
    generating a tuned plurality of modeled particle values by performing an iterative process a plurality of times starting with the initial plurality of particles, the iterative process comprising:

propagating each of the plurality of particles through a system model configured to represent a response of the battery system to the at least one parameter and the at least one state of the battery system represented by the plurality of particles to obtain a first plurality of modeled particle values;

assigning a weight to each of the plurality of modeled particle values based upon a comparison of the plurality of modeled particle values to at least one measurement of an electrical parameter of the battery system, wherein the weight represents a correlation between the modeled particle values and the at least one measurement of an electrical parameter of the battery system;

generating a successive plurality of particles based upon the weight assigned to each of the plurality of modeled particle values; and repeating the iterative process using the successive plurality of particles;

estimating at least one parameter of the battery system based on one or more of the tuned plurality of modeled particle values;

terminating the iterative process after a desired number of iterations have been performed to generate the tuned plurality of modeled particle values.

2. The method of claim 1, wherein the electrical parameter comprises an estimated open circuit voltage of the battery system.

3. The method of claim 2, further comprising estimating a state of charge of the battery system based on the estimated open circuit voltage of the battery system.

4. The method of claim 3, further comprising displaying an indication of the estimated state of charge to a user of the battery system.

5. The method of claim 3, further comprising initiating a charging operation by starting an internal combustion engine in communication with an electrical alternator, the electrical alternator being configured to charge the battery system when the estimated state of charge falls below a first threshold.

6. The method of claim 3, further comprising discontinuing a charging operation by stopping an internal combustion engine in communication with an electrical alternator, the electrical alternator being configured to charge the battery system when the estimated state of charge exceeds a second threshold.

7. The method of claim 3, further comprising generating an estimated state of health of the battery system based on the estimated open circuit voltage.

8. The method of claim 1, wherein the at least one measurement of the electrical parameter of the battery system comprises a measurement of a voltage between a set of terminals of the battery system, and the plurality of modeled particle values comprises an estimate of the voltage between the set of terminals.

9. The method of claim 1, wherein the at least one measurement of an electrical parameter of the battery system comprises a measurement of a current sourced by the battery system, and the plurality of modeled particle values comprises an estimate of the current sourced by the battery system.

10. The method of claim 1, wherein estimating the at least one parameter of the battery system based on one or more of the tuned plurality of modeled particle values comprises calculating a mean of the tuned plurality of modeled particle values.

11. The method of claim 1, wherein the at least one parameter of the battery system comprises one of an open circuit voltage; a capacity of the battery system; a voltage drop across a parallel resistor-capacitor circuit; a value of a resistor in the parallel resistor-capacitor circuit; and a value of a capacitor in the parallel resistor-capacitor circuit.

12. The method of claim 1, wherein the iterative process further comprises acquiring the at least one measurement of an electrical parameter of the battery system.

13. The method of claim 1, further comprising estimating a plurality of parameters of the battery system and applying a smoothing algorithm to the plurality of parameters.

14. A system comprising:
a sensor unit configured to receive at least one measurement of an electrical parameter of a battery system;
an engine control module communicatively coupled to the sensor unit and configured to:
generate an initial plurality of particles, each particle comprising a representation of at least parameter and at least one state of the battery system;
propagate each of the plurality of particles through a system model configured to represent a response of the battery system to the at least one parameter and the at least one state of the battery system represented by the plurality of particles to obtain a first plurality of modeled particle values;
assign a weight to each of the plurality of modeled particle values based upon a comparison of the plurality of modeled particle values to at least one measurement of an electrical parameter of the battery system received by the sensor unit, wherein the weight represents a correlation between the modeled particle values and the at least one measurement of an electrical parameter of the battery system;
generate a successive plurality of particles based upon the weight assigned to each of the plurality of modeled particle values; and
estimate at least one parameter of the battery system based on one or more of the tuned plurality of modeled particle values.

15. The system of claim 14, wherein the system model comprises one of a single resistor-capacitor circuit and a dual resistor-capacitor circuit.

16. The system of claim 14, wherein the estimate of at least one parameter comprises a state of charge of the battery system.

17. The system of claim 16, further comprising a control system configured to initiate a charging operation when the state of charge is below a first threshold using an internal combustion engine in communication with an electrical alternator, the electrical alternator in communication with the battery system.

18. The system of claim 16, further comprising terminating the charging operation when the state of charge is above a second threshold.

19. The system of claim 14, wherein the processing logic is further configured to estimate a plurality of parameters of the battery system and to apply a smoothing algorithm to the plurality of parameters.

* * * * *